US008867581B2

(12) United States Patent
Matsugai et al.

(10) Patent No.: US 8,867,581 B2
(45) Date of Patent: Oct. 21, 2014

(54) SEMICONDUCTOR LASER AND METHOD OF MANUFACTURING THE SAME

(71) Applicant: Sony Corporation, Tokyo (JP)

(72) Inventors: Hiroyasu Matsugai, Kanagawa (JP); Kei Satou, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/736,559

(22) Filed: Jan. 8, 2013

(65) Prior Publication Data

US 2013/0188662 A1 Jul. 25, 2013

(30) Foreign Application Priority Data

Jan. 25, 2012 (JP) ................ 2012-012655

(51) Int. Cl.
*H01S 5/00* (2006.01)
*H01S 5/30* (2006.01)
*H01L 21/02* (2006.01)

(52) U.S. Cl.
CPC ............ *H01S 5/30* (2013.01); *H01L 21/02518* (2013.01)
USPC .................. 372/43.01; 372/44.01; 372/45.01; 372/46.01; 372/46.013

(58) Field of Classification Search
CPC ........ H01S 5/00; H01S 5/0281; H01S 5/0425; H01S 5/1053; H01S 5/18347; H01S 5/22; H01S 5/2216; H01S 5/222
USPC ...................... 372/43.01, 44.01, 45.01, 46.01
See application file for complete search history.

(56) References Cited

U.S. PATENT DOCUMENTS

2005/0281304 A1* 12/2005 Mochida .................... 372/46.01
2010/0290496 A1* 11/2010 Takayama et al. ......... 372/46.012

FOREIGN PATENT DOCUMENTS

JP 09-221249 8/1997
JP 2005-187034 7/2005

* cited by examiner

*Primary Examiner* — Dung Nguyen
(74) *Attorney, Agent, or Firm* — K&L Gates LLP (57) ABSTRACT

A semiconductor laser includes: a semiconductor layer including an active layer and a ridge portion, the ridge portion facing a current injection region of the active layer; and an embedded film covering a side surface of the ridge portion and a top surface of the semiconductor layer, wherein the embedded film includes a first layer configured of a silicon oxide film, a second layer made of a silicon compound having a refractive index lower than that of the active layer and having a silicon content higher than a stoichiometric ratio, and a third layer made of an inorganic insulating material in this order of closeness to the ridge portion and the semiconductor layer.

13 Claims, 7 Drawing Sheets

SEMICONDUCTOR LASER AND METHOD OF MANUFACTURING THE SAME

CROSS REFERENCES TO RELATED APPLICATIONS

The present application claims priority to Japanese Priority Patent Application JP 2012-012655 filed in the Japan Patent Office on Jan. 25, 2012, the entire content of which is hereby incorporated by reference.

BACKGROUND

The present disclosure relates to a semiconductor laser including an embedded film provided around a ridge portion, and a method of manufacturing the same.

In recent years, as disclosed in Japanese Unexamined Patent Application Publication No. H9-221249 for example, in loss-guided type semiconductor lasers, a material having a higher refractive index than that of an active layer is disposed in close proximity to the active layer, and the effective refractive index is decreased by outcoupling of light to form a lateral waveguiding region.

In addition, for example, Japanese Unexamined Patent Application Publication No. 2005-187034 proposes a technique in which an insulating film and an absorption film containing silicon are provided on a non-ridge portion to suppress a high-order mode.

SUMMARY

However, in Japanese Unexamined Patent Application Publication No. H9-221249, since the material having a higher refractive index than that of the active layer is employed, light absorption is increased, and slope efficiency (gradient of L-I characteristics) is decreased, and an operation current is increased. In addition, in Japanese Unexamined Patent Application Publication No. 2005-187034, since the film property of the absorbing film is poor, deterioration in characteristics is caused.

It is therefore desirable to provide a semiconductor laser that allows to suppress an increase in drive current and deterioration in characteristics, and a method of manufacturing the semiconductor laser.

A semiconductor laser according to an embodiment of the present disclosure includes: a semiconductor layer including an active layer and a ridge portion, the ridge portion facing a current injection region of the active layer; and an embedded film covering a side surface of the ridge portion and a top surface of the semiconductor layer, wherein the embedded film includes a first layer configured of a silicon oxide film, a second layer made of a silicon compound having a refractive index lower than that of the active layer and having a silicon content higher than a stoichiometric ratio, and a third layer made of an inorganic insulating material in this order of closeness to the ridge portion and the semiconductor layer.

In the semiconductor laser according to the embodiment of the present disclosure, the embedded film includes the first layer, the second layer, and the third layer in this order from the ridge portion side and the semiconductor layer side. The first layer configured of a silicon oxide film causes a difference in refractive index between the inside and outside of the ridge portion, and thus a waveguide is formed. Since the second layer is made of a silicon compound which has a refractive index lower than that of the active layer and has a silicon content higher than the stoichiometric ratio, light leakage from the active layer is suppressed, and moreover, even if light is leaked from the active layer, the leaked light is absorbed by the second layer. Consequently, an increase in drive current is suppressed. In addition, the second layer is made of a silicon compound having a silicon content higher than the stoichiometric ratio, and is therefore poor in film quality. However, since the second layer is covered with the third layer made of an inorganic insulating material, the deterioration in characteristics is suppressed.

A method of manufacturing a semiconductor laser according to an embodiment of the present disclosure includes: forming a semiconductor layer including an active layer; forming, in the semiconductor layer, a ridge portion facing a current injection region of the active layer; and forming an embedded film on a side surface of the ridge portion and on a top surface of the semiconductor layer, wherein as the embedded film, a first layer configured of a silicon oxide film, a second layer made of a silicon compound having a refractive index lower than that of the active layer and having a silicon content higher than a stoichiometric ratio, and a third layer made of an inorganic insulating material are formed in this order of closeness to the ridge portion and the semiconductor layer.

According to the semiconductor laser and the method of manufacturing the semiconductor laser of the embodiments of the present disclosure, as the embedded film, the first layer configured of a silicon oxide film, the second layer made of a silicon compound which has a refractive index lower than that of the active layer and has a silicon content higher than the stoichiometric ratio, and the third layer made of an insulating material are formed in this order from the ridge portion side and the semiconductor layer side. As a result, it is possible to suppress the increase in drive current and the deterioration in characteristics.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

With reference to the drawings, an embodiment of the present disclosure will be described in detail below.

Figure 1:
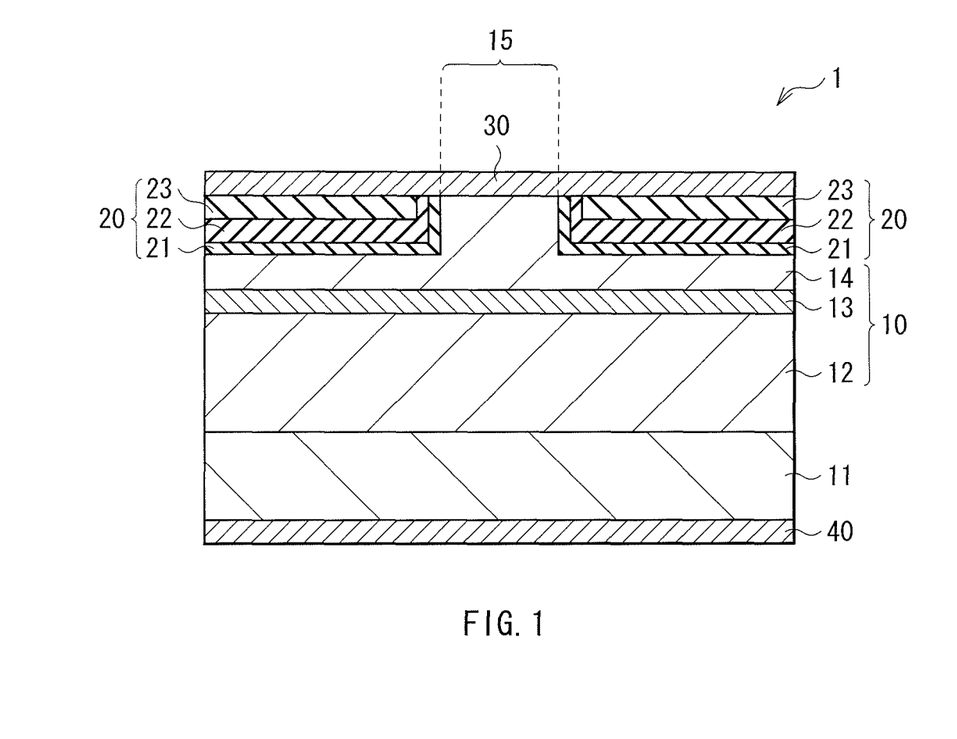
FIG. 1 is a sectional view showing a configuration of a semiconductor laser according to an embodiment of the present disclosure.

FIG. 1 shows a general configuration of a semiconductor laser according to an embodiment of the present disclosure. For example, this semiconductor laser 1 is a blue/blue-violet semiconductor laser which is used as a laser for recording and/or playback of BD in a personal computer and a home-use game machine, and which has an oscillation wavelength of about 500 nm or less, for example, around 400 nm. The semiconductor laser 1 includes, for example, on one side (top surface) of a substrate 11 made of GaN, a semiconductor layer 10, an embedded film 20, and a p-side electrode 30. On the other side (bottom surface) of the substrate 11, an n-side electrode 40 is provided.

The semiconductor layer 10 has a configuration in which an n-type semiconductor layer 12, an active layer 13, and a p-type semiconductor layer 14 are stacked on the substrate 11 in this order. A stripe-shaped ridge portion 15 for current confinement is provided to the p-type semiconductor layer 14 to face a current injection region (light emitting region) of the active layer 13.

The substrate 11 is made of n-type GaN doped with silicon (Si) as n-type impurities, for example.

The n-type semiconductor layer 12 includes an n-type cladding layer and an n-side guide layer provided in this order from the substrate 11 side, for example. The n-type cladding layer is 2.5 µm to 2.6 µm both inclusive in thickness along a stacking direction (hereinafter referred to simply as thickness), and is made of n-type AlGaN mixed crystal doped with silicon (Si) as n-type impurities, for example. The n-side guide layer is 0.21 µm in thickness, and is made of n-type GaN doped with silicon (Si) as n-type impurities, for example.

The active layer 13 is 0.056 µm in thickness, and has a multiquantum well structure including a well layer and a barrier layer which are made of InxGa1−xN (where, x≥0) mixed crystal and are different from each other in composition thereof, for example.

The p-type semiconductor layer 14 includes a p-side guide layer, an electron barrier layer, a p-type cladding layer, and a p-side contact layer in this order from the substrate 11 side, for example. The p-side guide layer is 0.19 µm in thickness, and is made of p-type GaN doped with magnesium (Mg) as p-type impurities, for example. The electron barrier layer is 0.02 µm in thickness, and is made of p-type AlGaN mixed crystal doped with magnesium (Mg) as p-type impurities, for example. The p-type cladding layer is 0.38 µm in thickness, and has a superlattice structure of an AlGaN mixed crystal layer and a p-type GaN layer doped with magnesium (Mg) as p-type impurities, for example. The p-side contact layer is 0.10 µm in thickness, and is made of p-type GaN doped with magnesium (Mg) as p-type impurities, for example.

The embedded film 20 has a configuration in which a first layer 21, a second layer 22, and a third layer 23 are stacked in this order of closeness to the ridge portion 15 and the semiconductor layer 10. The first layer 21 is configured of a silicon oxide film. The second layer 22 is made of a silicon compound which has a refractive index lower than that of the active layer 13 and has a silicon content higher than a stoichiometric ratio. The third layer 23 is made of an inorganic insulating material. With this configuration, the semiconductor laser 1 allows to suppress the increase in drive current and deterioration in characteristics.

The first layer 21 forms a waveguide by causing a difference in refractive index between the inside and outside of the ridge portion 15, and has a function of adjusting the slope efficiency as will be described later. The first layer 21 is configured of a silicon oxide film as described above, and the refractive index thereof is 1.4 to 1.6 both inclusive, for example, and the extinction coefficient k is zero (k=0). Incidentally, the refractive index of the semiconductor layer 10 is about 2.5.

Now, the adjustment of the slope efficiency that is one of the functions of the first layer 21 will be described. The method of adjusting the slope efficiency should be considered based on two characteristics: the thickness of the first layer 21 and the light absorptance (extinction coefficient) of the second layer 22. Specifically, the semiconductor laser 1 becomes less sensitive to light of the second layer 22 when the thickness of the first layer 21 is increased, and therefore it is necessary to increase the extinction coefficient of the second layer 22. On the other hand, the semiconductor laser 1 becomes sensitive to the light of the second layer 22 when the thickness of the first layer 21 is reduced, and therefore it is necessary to decrease the absorption coefficient of the second layer 22.

Figure 2:
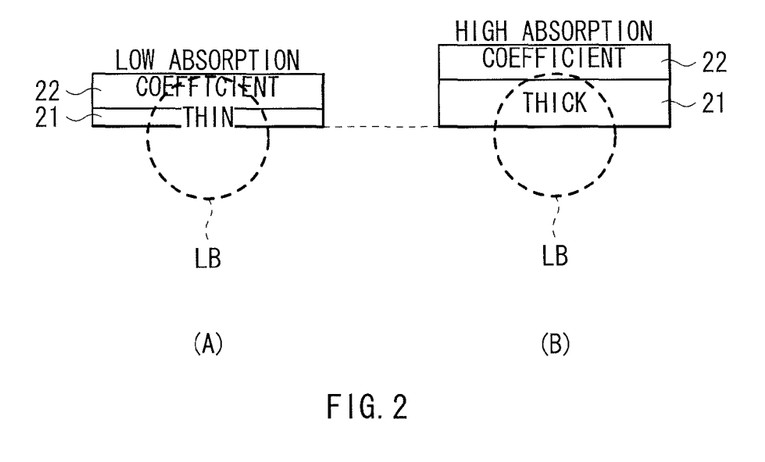
FIG. 2 is a view for explaining a method of adjusting slope efficiency.

For example, when the thickness of the first layer 21 is reduced and the extinction coefficient of the second layer 22 is decreased as illustrated in (A) of FIG. 2, it is necessary to set the thickness of the first layer 21 to about several nanometers in order to obtain a practical slope efficiency, and variation in the slope efficiency due to the non-uniformity of the thickness of the first layer 21 may not be tolerated. In addition, the insulation function is decreased when the thickness of the first layer 21 is reduced, and thus the pressure resistance and the ESD (electrostatic discharge) characteristics may be degraded. If the thickness of the first layer 21 is further reduced, the effect defining the waveguide is decreased, and light leakage becomes significant, and moreover, the operation voltage of laser oscillation may be increased, and the output thereof may become unstable.

In addition, when the thickness of the first layer 21 is increased, and the extinction coefficient of the second layer 22 is increased as illustrated in (B) of FIG. 2, light absorption is increased, and the slope efficiency is decreased, and therefore the operation voltage has to be increased. If the thickness of the first layer 21 is further increased, the semiconductor laser 1 becomes insensible to the light of the second layer 22.

Therefore, the thickness of the first layer 21 is preferably 20 nm to 200 nm both inclusive, for example. The higher the refractive index of the second layer 22, the higher the extinction coefficient thereof, and in the case where the second layer 22 has a refractive index equivalent to that of the active layer 13, if the thickness of the first layer 21 is smaller than 20 nm, then the slope efficiency is lower than 1, which is not practicable. In addition, when the thickness of the first layer 21 is greater than 200 nm, the semiconductor laser 1 becomes less sensible to the light of the second layer 22 even if the extinction coefficient k of the second layer 22 is sufficiently increased.

In order to suppress the light leakage from the active layer 13, the second layer 22 has a refractive index lower than that of the active layer 13, as described above. The extinction coefficient k of the second layer 22 is preferably higher than zero (0) and equal to or lower than 0.5, more preferably, 0.1 to 0.3 both inclusive, for example. When the extinction coefficient k of the second layer 22 falls within this range, it is possible to make the refractive index of the second layer 22 lower than the refractive index of the active layer 13.

In addition, even when light leaks from the active layer 13, the second layer 22 has a function as a light absorption film that absorbs the leaked light. Therefore, the second layer 22 is made of a silicon compound having a silicon content higher than the stoichiometric ratio as described above. Preferably, the second layer 22 is configured of a silicon nitride film that has good thermal stability. In other words, the second layer 22 contains a Si—Si bond, and light is absorbed by the Si—Si bond. The Si—Si bond is not contained in a silicon nitride film that absorbs no light (extinction coefficient k=0), and the higher the extinction coefficient k, the larger the number of the Si—Si bond contained therein. For example, in the case of a silicon nitride film whose extinction coefficient k is 0, the silicon content is 36.6%, and the percentage of the Si—Si bond contained therein is zero (0). In the case of a silicon nitride film whose extinction coefficient k is 0.2724, the silicon content is 42.5%, 6.7% of which being the Si—Si bond.

When the extinction coefficient k of the second layer 22 is 0.3 or lower as described above for example, the percentage of the Si—Si bond contained in the second layer 22 is about 7.1% or lower. In the case where the extinction coefficient k of the second layer 22 is 0.5 or lower as described above for example, the percentage of the Si—Si bond contained in the second layer 22 is 12% or lower, for example.

The thickness of the second layer 22 is preferably 20 nm or more, for example. When the thickness is smaller than 20 nm, the slope efficiency may be excessively increased. Further, it is more preferable that the thickness of the second layer 22 be 20 nm to 100 nm both inclusive. When the thickness is greater than 200 nm, the slope efficiency saturates with respect to the film thickness, and the process margin is increased. In this case, however, the film formation time is increased, and the margin of etching for forming the p-side electrode 30 in a subsequent process is decreased. Accordingly, it is preferable that the thickness of the second layer 22 be 20 nm or larger, for example, around 100 nm.

The third layer 23 functions as a sealing layer and a protective layer (passivation layer), and is made of an inorganic insulating material. Since the second layer 22 has a high silicon content, many dangling-bonds are also included therein, and thus the film quality is poor; therefore, leakage or the like may easily occur. However, by covering the second layer 22 with the third layer 23 to seal the second layer 22, it is possible to reduce the degradation of characteristics.

It is preferable that the third layer 23 be configured of, for example, a silicon oxide film ($SiO_2$), an aluminum oxide film ($Al_2O_3$), an aluminum nitride film (AlN), a silicon nitride film ($SiN_x$), a tantalum oxide film ($Ta_2O_5$), or a zirconium oxide film ($ZrO_2$). Among them, it is preferable that the third layer 23 be configured of a silicon nitride film having a silicon content equal to or close to the stoichiometric ratio, that the refractive index n thereof be 1.8 to 2.2 both inclusive, and that the extinction coefficient k thereof be zero (0). This is because such a silicon nitride film achieves good film quality, and has both pressure resistance and a sealing property.

From the standpoint of the sealing property and the insulation property, the thickness of the third layer 23 is preferably 50 nm or more, for example. In addition, although it is desirable to set the thickness of the third layer 23 as large as possible from the standpoint of the sealing property, the film may crack when the thickness thereof is increased, and therefore, the thickness is desirably 500 nm or less, for example.

It is to be noted that, even in the case where the second layer 22 and the third layer 23 are each configured of a silicon nitride film, the layers may be analyzed by investigating the difference in silicon content thereof. In addition, when immersed in hydrofluoric acid, there is formed a step between the second layer 22 and the third layer 23 since the second layer 22 has a higher etching rate than the third layer 23, thus allowing analysis.

FIG. 3 to FIG. 9 show calculation results based on the above description. It is to be noted that the calculations were carried out under the following conditions with use of ATLAS.

First Layer 21
Material: $SiO_2$ (film formation method: deposition)
The thickness at the flat portion on the top surface side of the semiconductor layer 10: 40 nm
The thickness at the lateral side of the ridge portion 15: 28 nm (70% of the flat portion)
Refractive index: 1.46
Extinction coefficient k: zero (0)
Second Layer 22
Material: SiN
The thickness at the flat portion on the top surface side of the semiconductor layer 10: 100 nm
The thickness at the lateral side of the ridge portion 15: 50 nm (50% of the flat portion)
Refractive index: 2.49
Extinction coefficient k: 0.185
Third Layer 23
Material: SiN
Refractive index n: 2.04
Extinction coefficient k: zero (0)
Active Layer 13
Refractive index n: 2.64

Figure 3:
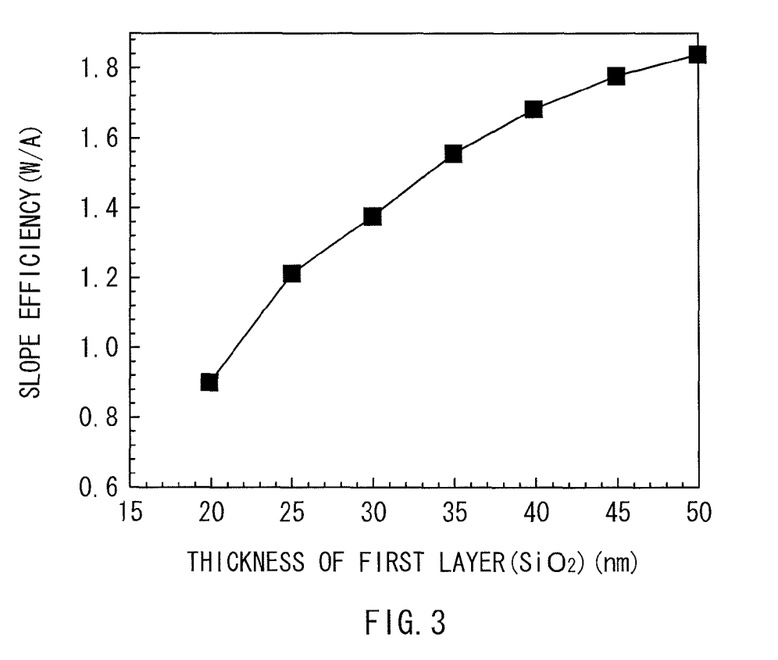
FIG. 3 is a diagram showing results of an experiment on the relationship between the thickness of a first layer illustrated in FIG. 1 and the slope efficiency.

FIG. 3 shows results of an experiment on the relationship between the thickness of the first layer 21 and the slope efficiency. As can be seen from FIG. 3, when the thickness of the first layer 21 is 20 nm, the slope efficiency is about 0.9, and the slope efficiency increases as the thickness of the first layer 21 increases. That is, it is possible that when the lower limit of the thickness of the first layer 21 is set to 20 nm or more, the slope efficiency of 1 or more, which is practical, is obtained.

Figure 4:
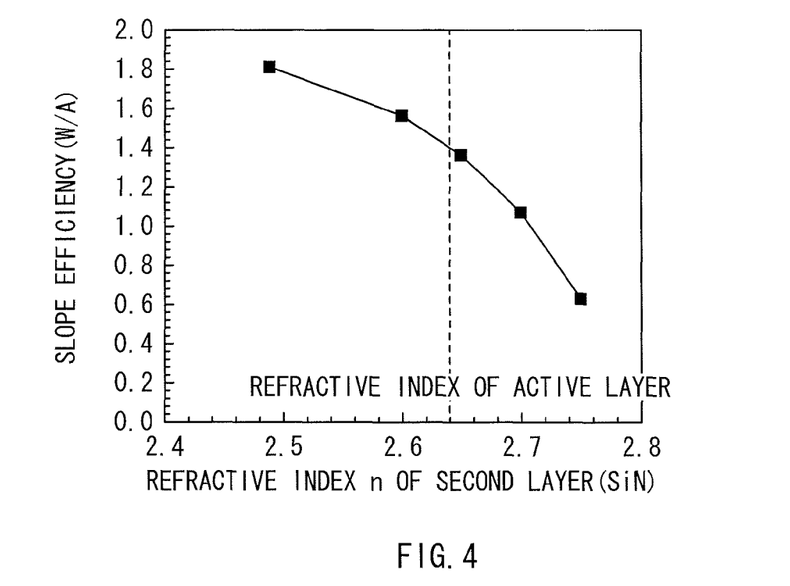
FIG. 4 is a diagram showing results of an experiment on the relationship between the refractive index of a second layer illustrated in FIG. 1 and the slope efficiency.

FIG. 4 shows results of an experiment on the relationship between the refractive index of the second layer 22 and the slope efficiency. As can be seen from FIG. 4, as the refractive index n of the second layer 22 increases, the slope efficiency decreases. Further, when the refractive index n of the second layer 22 becomes higher than the refractive index (2.64) of the active layer 13, the gradient of decrease in slope efficiency becomes steep, and the efficiency is significantly decreased. That is, when the refractive index n of the second layer 22 is set to be lower than the refractive index of the active layer 13, it is possible to suppress a drastic decrease of the slope efficiency while securing a margin for variation in refractive index.

Figure 5:
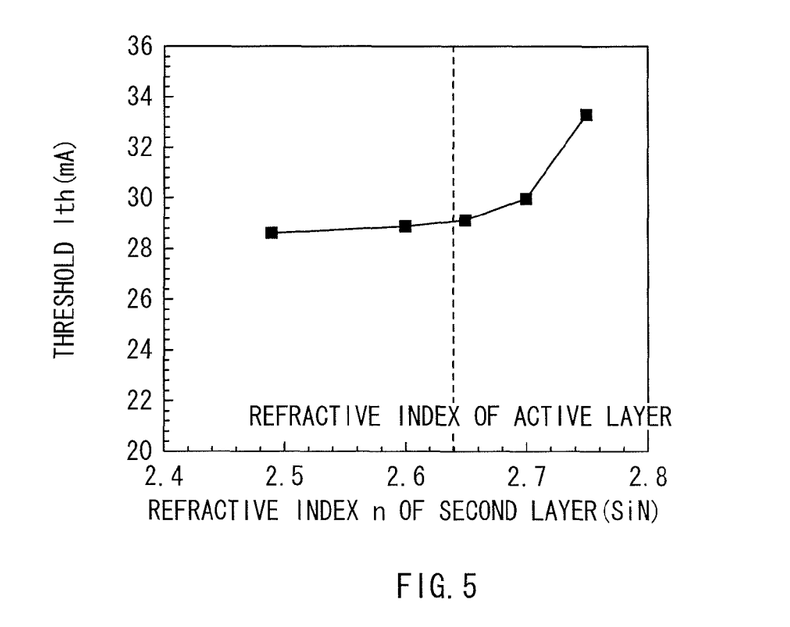
FIG. 5 is a diagram showing results of an experiment on the relationship between the refractive index of the second layer illustrated in FIG. 1 and a threshold value Ith.

FIG. 5 shows results of an experiment on the relationship between the refractive index of the second layer 22 and the threshold value Ith. As can be seen from FIG. 5, as the refractive index of the second layer 22 increases, the drive current increases. Further, when the refractive index n of the second layer 22 becomes higher than the refractive index (2.64) of the active layer 13, the gradient of increase of the drive current becomes steep, and the efficiency is significantly decreased.

Figure 6:
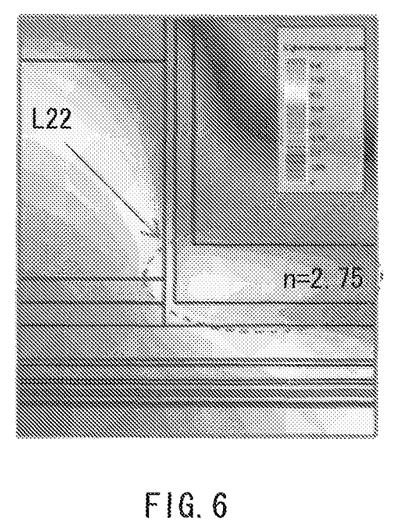
FIG. 6 is a diagram showing results of an experiment on a leakage of an optical field into the second layer in the case where, in FIG. 5, a refractive index n of the second layer is 2.75.
Figure 7:
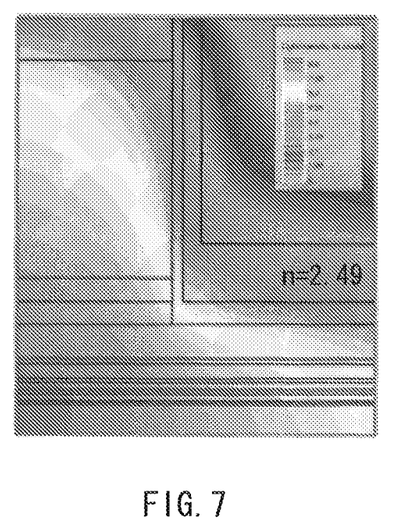
FIG. 7 is a diagram showing results of an experiment on a leakage of an optical field into the second layer in the case where, in FIG. 5, the refractive index n of the second layer is 2.49.

FIG. 6 shows results of an experiment on leakage of an optical field into the second layer 22 in the case where, in FIG. 5, the refractive index n of the second layer 22 is 2.75. FIG. 7 shows results of an experiment on leakage of an optical field into the second layer 22 in the case where, in FIG. 5, the refractive index n of the second layer 22 is 2.49. As can be seen from FIG. 6 and FIG. 7, leakage L22 of an optical field into the second layer 22 is caused when the refractive index n of the second layer 22 is 2.75, whereas the leakage of the optical field into the second layer 22 is suppressed when the refractive index n of the second layer 22 is 2.49.

In other words, when the refractive index n of the second layer 22 is set to be lower than that of the active layer 13, it is possible to suppress the leakage L22 of the optical field into the second layer 22, and thus to suppress the increase of the drive current.

Figure 8:
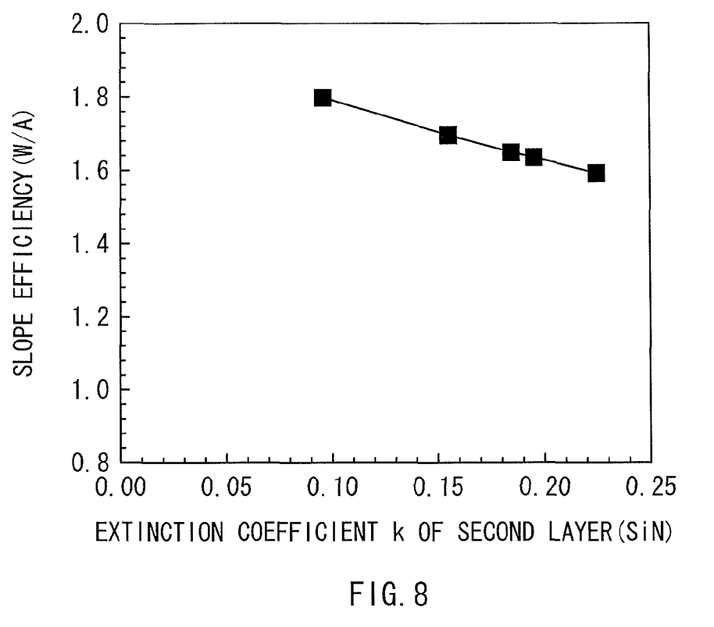
FIG. 8 is a diagram showing results of an experiment on the relationship between an extinction coefficient of the second layer illustrated in FIG. 1 and the slope efficiency.

FIG. 8 shows results of an experiment on the relationship between the extinction coefficient k of the second layer 22 and the slope efficiency. As can be seen from FIG. 8, as the extinction coefficient k of the second layer 22 increases, the slope efficiency gradually decreases. Accordingly, it is possible that when the extinction coefficient k of the second layer 22 is set to be higher than zero (0) and equal to or lower than 0.5, more preferably 0.1 to 0.3 both inclusive, a favorable slope efficiency is obtained.

Figure 9:
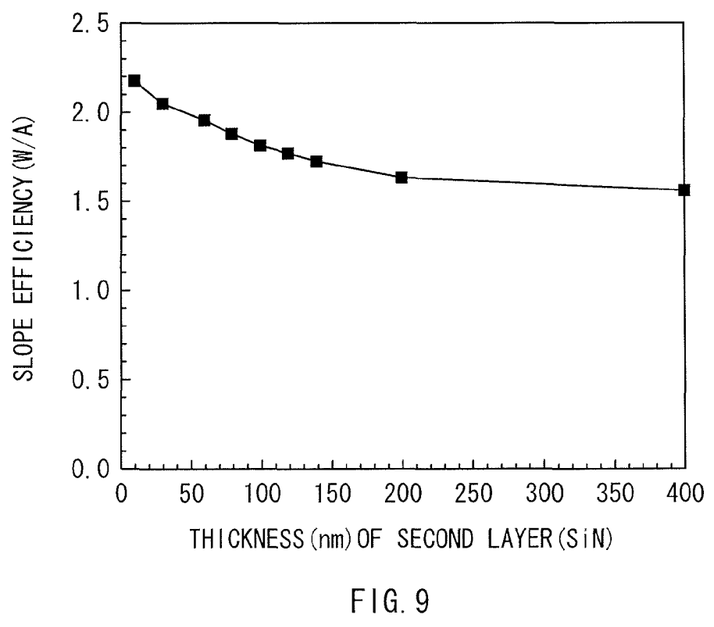
FIG. 9 is a diagram showing results of an experiment on the relationship between the thickness of the second layer illustrated in FIG. 1 and the slope efficiency.

FIG. 9 shows results of an experiment on the relationship between the thickness of the second layer 22 and the slope efficiency. It is to be noted that FIG. 9 shows calculation results in the case where the refractive index of the second layer 22 is 2.49. As can be seen from FIG. 9, as the thickness of the second layer 22 increases, the slope efficiency gradually decreases. Accordingly, it is possible that when the thickness of the second layer 22 is set to 20 nm or more, preferably 20 nm to 100 nm both inclusive, a favorable slope efficiency is obtained.

The p-side electrode 30 illustrated in FIG. 1 is provided on the ridge portion 15 of the p-type semiconductor layer 14. For example, the p-side electrode 30 has a configuration in which palladium (Pd), platinum (Pt), and gold (Au) are sequentially stacked from the p-type semiconductor layer 14 side. The p-side electrode 30 is electrically connected to the p-type semiconductor layer 14.

For example, the n-side electrode 40 illustrated in FIG. 1 has a configuration in which titanium (Ti), platinum (Pt), and gold (Au) are sequentially stacked. The n-side electrode 40 is electrically connected to the n-type semiconductor layer 12 with the substrate 11 in between.

It is to be noted that, in the semiconductor layer 10 illustrated in FIG. 1, surfaces facing each other in a length direction (resonator direction) of the ridge portion 15 are a pair of resonator end surfaces (not illustrated). The pair of resonator end surfaces are provided with a pair of reflecting mirror films (not illustrated), respectively. One of the pair of reflecting mirror films is so adjusted as to have a low reflectance, and the other of the pair of reflecting mirror films is so adjusted as to have a high reflectance. With this configuration, light generated in the active layer 13 is reciprocated between the pair of reflecting mirror films and amplified, and emitted as a laser beam from one of the reflecting mirror films.

The semiconductor laser 1 is manufactured as follows, for example.

Figure 10A:
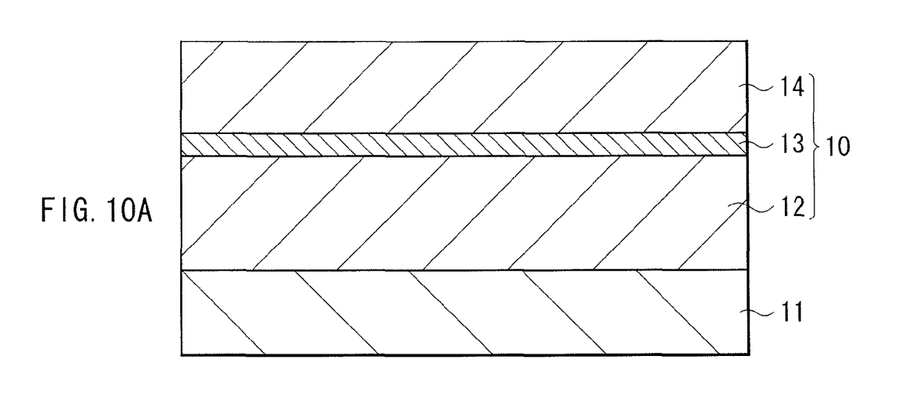
FIGS. 10A and 10B are sectional views showing a method of manufacturing the semiconductor laser illustrated in FIG. 1 in the order of processes.

First, as illustrated in FIG. 10A, the substrate 11 made of GaN is prepared, and the n-type semiconductor layer 12, the active layer 13, and the p-type semiconductor layer 14 which are made of the above-described materials are grown on the surface of the substrate 11 by, for example, the MOCVD (metal organic chemical vapor deposition) method to form the semiconductor layer 10.

Figure 10B:
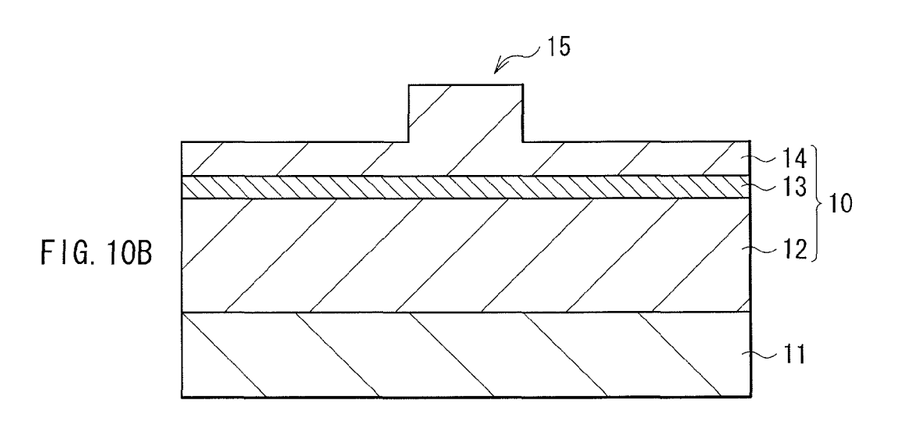

Next, as illustrated in FIG. 10B, a mask for etching is formed on the p-type semiconductor layer 14, and a part of the p-type semiconductor layer 14 in a thickness direction is removed by, for example, dry etching to form the stripe-shaped ridge portion 15.

Figure 11:
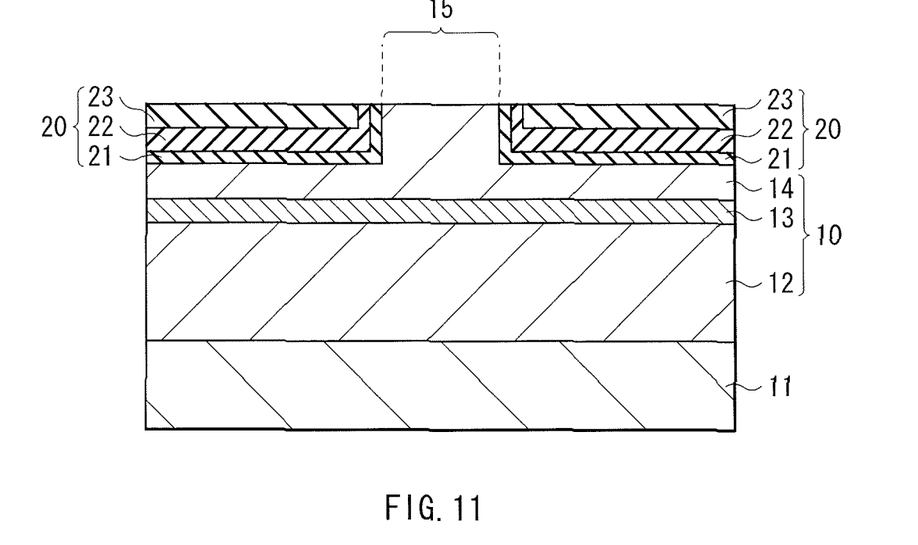
FIG. 11 is a sectional view showing a step subsequent to FIG. 10B.

Next, as illustrated in FIG. 11, on the side surfaces of the ridge portion 15 and on the top surface of the semiconductor layer 10, the first layer 21, the second layer 22, and the third layer 23 are formed in this order from the ridge portion 15 side and the semiconductor layer 10 side to form the embedded film 20. At this time, it is preferable that the second layer 22 and the third layer 23 be continuously formed in the same apparatus and the same room. This is because, if the second layer 22 and the third layer 23 are brought to the outside in the course of the formation, a natural oxide film ($SiO_2$) is formed on a an interface between the second layer 22 and the third layer 23, and thus the adhesion thereof may be decreased.

Thereafter, as illustrated in FIG. 1, the p-side electrode 30 is formed on the embedded film 20 and the semiconductor layer 10. In addition, a rear surface of the substrate 11 is, for example, lapped and polished until the thickness of the substrate 11 becomes, for example, about 100 nm, and then the n-side electrode 40 is formed on the bottom surface (rear surface) of the substrate 11.

Thereafter, the pair of resonator end surfaces are formed by cleavage, and end surface coating is applied on the pair of resonator end surfaces as appropriate to form the reflecting mirror films. Thus, the semiconductor laser 1 illustrated in FIG. 1 is completed.

In the semiconductor laser 1, when a predetermined voltage is applied between the n-side electrode 40 and the p-side electrode 30, a current is injected into the active layer 13, and light is generated by recombination of electrons and holes. This light is reflected by the pair of reflecting mirror films, and reciprocated therebetween to cause laser oscillation, and then emitted to the outside as a laser beam. In this instance, the embedded film 20 includes the first layer 21, the second layer 22, and the third layer 23 in this order from the ridge portion 15 side and the semiconductor layer 10 side. The first layer 21 configured of a silicon oxide film causes a difference in refractive index between the inside and outside of the ridge portion 15, and thus a waveguide is formed. Since the second layer 22 is configured of a silicon nitride film which has a refractive index lower than that of the active layer 13 and has a silicon content higher than the stoichiometric ratio, light leakage from the active layer 13 is suppressed, and moreover, even if light is leaked from the active layer 13, the leaked light is absorbed by the second layer 22. Consequently, an increase in drive current is suppressed. In addition, the second layer 22 is configured of a silicon nitride film having a silicon content higher than the stoichiometric ratio, and is therefore poor in film quality. However, since the second layer 22 is covered with the third layer 23 made of an inorganic insulating material, the deterioration in characteristics is suppressed.

As described above, in the present embodiment, as the embedded film 20, the first layer 21 configured of a silicon oxide film, the second layer 22 configured of a silicon nitride film which has a refractive index lower than that of the active layer 13 and has a silicon content higher than the stoichiometric ratio, and the third layer 23 made of an insulating material are formed in this order of closeness to the ridge portion 15 and the semiconductor layer 10. As a result, it is possible to suppress the increase in drive current and deterioration in characteristics.

Hereinabove, while the present disclosure has been described in conjunction with the embodiment, the present disclosure is not limited to the above-mentioned embodiment, and various modifications may be made. For example, the material and the thickness of the layers, the method of forming the films, the conditions for forming the films, and the like described in the above-mentioned embodiment are not limitative, and other materials and thicknesses, other methods for forming the films, and other conditions for forming the films may also be employed. For example, while the n-type semiconductor layer 12, the active layer 13, and the p-type semiconductor layer 14 are formed by the MOCVD method in the above-mentioned embodiment, the layers may also be formed by other metal organic chemical vapor deposition methods such as the MOVPE method, or the MBE (molecular beam epitaxy) method or the like.

Additionally, for example, while the configuration of the semiconductor laser 1 is described in detail in the above-mentioned embodiment, all of the layers may not necessarily be included, and other layers may be further included.

Furthermore, the present disclosure is not limited to the blue/blue-violet semiconductor laser configured of a group-III-V nitride semiconductor containing at least gallium (Ga) among group III elements and at least nitrogen (N) among group V elements described in the above-mentioned embodiment, and is applicable to those which provide higher output, or those of other oscillation wavelengths or other materials.

Note that the technology may be configured as follows.

(1) A semiconductor laser including:
a semiconductor layer including an active layer and a ridge portion, the ridge portion facing a current injection region of the active layer; and
an embedded film covering a side surface of the ridge portion and a top surface of the semiconductor layer, wherein
the embedded film includes
a first layer configured of a silicon oxide film,
a second layer made of a silicon compound having a refractive index lower than that of the active layer and having a silicon content higher than a stoichiometric ratio, and
a third layer made of an inorganic insulating material
in this order of closeness to the ridge portion and the semiconductor layer.

(2) The semiconductor laser according to (1), wherein an extinction coefficient of the second layer is higher than zero (0), and equal to or lower than 0.5.

(3) The semiconductor laser according to (1) or (2), wherein the second layer is configured of a silicon nitride film having a silicon content higher than a stoichiometric ratio.

(4) The semiconductor laser according to (3), wherein the second layer contains a Si—Si bond, and the percentage of the Si—Si bond contained in the second layer is about 12% or lower.

(5) The semiconductor laser according to (4), wherein the second layer has a thickness of about 20 nm or more.

(6) The semiconductor laser according to any one of (1) to (5), wherein the first layer has a refractive index of about 1.4 to 1.6 both inclusive.

(7) The semiconductor laser according to (6), wherein the first layer has a thickness of about 20 nm to 200 nm both inclusive.

(8) The semiconductor laser according to any one of (1) to (7), wherein the third layer is configured of a silicon nitride film having a silicon content equal to or close to a stoichiometric ratio.

(9) The semiconductor laser according to (8), wherein the third layer has a refractive index of about 1.8 to 2.2 both inclusive.

(10) The semiconductor laser according to (9), wherein the third layer has an extinction coefficient of zero.

(11) The semiconductor laser according to (10), wherein the third layer has a thickness of about 50 nm or more.

(12) A method of manufacturing a semiconductor laser including:
forming a semiconductor layer including an active layer;
forming, in the semiconductor layer, a ridge portion facing a current injection region of the active layer; and
forming an embedded film on a side surface of the ridge portion and on a top surface of the semiconductor layer, wherein
as the embedded film,
a first layer configured of a silicon oxide film,
a second layer made of a silicon compound having a refractive index lower than that of the active layer and having a silicon content higher than a stoichiometric ratio, and
a third layer made of an inorganic insulating material
are formed in this order of closeness to the ridge portion and the semiconductor layer.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A semiconductor laser comprising:
a semiconductor layer including an active layer and a ridge portion, the ridge portion facing a current injection region of the active layer; and
an embedded film covering a side surface of the ridge portion and a top surface of the semiconductor layer, wherein
the embedded film includes
a first layer configured of a silicon oxide film,
a second layer made of a silicon compound having a refractive index lower than that of the active layer and having a silicon content higher than a stoichiometric ratio, and
a third layer made of an inorganic insulating material
in this order of closeness to the ridge portion and the semiconductor layer.

2. The semiconductor laser according to claim 1, wherein an extinction coefficient of the second layer is higher than zero (0), and equal to or lower than 0.5.

3. The semiconductor laser according to claim 1, wherein the second layer is configured of a silicon nitride film having a silicon content higher than a stoichiometric ratio.

4. The semiconductor laser according to claim 3, wherein the second layer contains a Si—Si bond.

5. The semiconductor laser according to claim 4, wherein the second layer has a thickness of about 20 nm or more.

6. The semiconductor laser according to claim 1, wherein the first layer has a refractive index of about 1.4 to 1.6 both inclusive.

7. The semiconductor laser according to claim 6, wherein the first layer has a thickness of about 20 nm to 200 nm both inclusive.

8. The semiconductor laser according to claim 1, wherein the third layer is configured of a silicon nitride film having a silicon content equal to or close to a stoichiometric ratio.

9. The semiconductor laser according to claim 8, wherein the third layer has a refractive index of about 1.8 to 2.2 both inclusive.

10. The semiconductor laser according to claim 9, wherein the third layer has an extinction coefficient of zero.

11. The semiconductor laser according to claim 10, wherein the third layer has a thickness of about 50 nm or more.

12. The semiconductor laser according to claim 4, wherein the percentage of the Si—Si bond contained in the second layer is about 12% or lower.

13. A method of manufacturing a semiconductor laser comprising:
   forming a semiconductor layer including an active layer;
   forming, in the semiconductor layer, a ridge portion facing a current injection region of the active layer; and
   forming an embedded film on a side surface of the ridge portion and on a top surface of the semiconductor layer, wherein
   as the embedded film,
   a first layer configured of a silicon oxide film,
   a second layer made of a silicon compound having a refractive index lower than that of the active layer and having a silicon content higher than a stoichiometric ratio, and
   a third layer made of an inorganic insulating material
   are formed in this order of closeness to the ridge portion and the semiconductor layer.

* * * * *